(12) United States Patent
Palmisano et al.

(10) Patent No.: US 6,544,078 B2
(45) Date of Patent: Apr. 8, 2003

(54) BATTERY CLAMP WITH INTEGRATED CURRENT SENSOR

(75) Inventors: Andrew J. Palmisano, Darien, IL (US); Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/908,389

(22) Filed: Jul. 18, 2001

(65) Prior Publication Data

US 2003/0017753 A1 Jan. 23, 2003

(51) Int. Cl.[7] .................................................. H01R 4/42
(52) U.S. Cl. ........................ 439/762; 439/488; 439/620; 320/165
(58) Field of Search ................................ 439/762, 503, 439/504, 506, 502, 488, 620, 622; 320/165, 162; 324/433

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |

(List continued on next page.)

OTHER PUBLICATIONS

"Alligator Clips with Wire Penetrators" J.S. Popper, Inc. product information, downloaded from http://www.jspopper.com/, undated.

(List continued on next page.)

Primary Examiner—P. Austin Bradley
Assistant Examiner—Ross Gushi
(74) Attorney, Agent, or Firm—Westman, Champlin & Kelly

(57) ABSTRACT

An apparatus configured to couple to a battery contact is provided. The apparatus includes an electrical connector for connection to a battery contact and a current sensor coupled to the electrical connector, the current sensor is used for measuring current through an electrical conductor. In addition, a method of coupling an electrical circuit to a battery contact is provided.

36 Claims, 10 Drawing Sheets

U.S. PATENT DOCUMENTS

| | | | |
|---|---|---|---|
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/23 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |

| | | | |
|---|---|---|---|
| 5,637,978 A | 6/1997 | Kellett et al. ................. 320/2 |
| 5,642,031 A | 6/1997 | Brotto ........................ 320/21 |
| 5,650,937 A | 7/1997 | Bounaga ..................... 364/483 |
| 5,652,501 A | 7/1997 | McClure et al. ............. 320/17 |
| 5,653,659 A | 8/1997 | Kunibe et al. ............... 477/111 |
| 5,656,920 A | 8/1997 | Cherng et al. ................ 320/31 |
| 5,675,234 A | 10/1997 | Greene ........................ 320/15 |
| 5,677,077 A | 10/1997 | Faulk .......................... 429/90 |
| 5,699,050 A | 12/1997 | Kanazawa ................. 340/636 |
| 5,701,089 A | 12/1997 | Perkins ....................... 327/772 |
| 5,705,929 A | 1/1998 | Caravello et al. ........... 324/430 |
| 5,710,503 A | 1/1998 | Sideris et al. .................. 320/6 |
| 5,717,336 A | 2/1998 | Basell et al. ................. 324/430 |
| 5,717,937 A | 2/1998 | Fritz .................... 395/750.01 |
| 5,739,667 A | 4/1998 | Matsuda et al. .............. 320/5 |
| 5,747,909 A | 5/1998 | Syverson et al. ........... 310/156 |
| 5,754,417 A | 5/1998 | Nicollini ..................... 363/60 |
| 5,757,192 A | 5/1998 | McShane et al. ........... 324/427 |
| 5,760,587 A | 6/1998 | Harvey ....................... 324/434 |
| 5,773,978 A | 6/1998 | Becker ....................... 324/430 |
| 5,789,899 A | 8/1998 | van Phuoc et al. ........... 320/30 |
| 5,793,359 A | 8/1998 | Ushikubo ................... 345/169 |
| 5,808,469 A | 9/1998 | Kopera ...................... 324/43.4 |
| 5,818,234 A * | 10/1998 | McKinnon ................. 324/433 |
| 5,821,756 A | 10/1998 | McShane et al. ........... 324/430 |
| 5,825,174 A | 10/1998 | Parker ......................... 324/106 |
| 5,831,435 A | 11/1998 | Troy .......................... 324/426 |
| 5,862,515 A | 1/1999 | Kobayashi et al. ........... 702/63 |
| 5,872,443 A | 2/1999 | Williamson .................. 320/21 |
| 5,895,440 A | 4/1999 | Proctor et al. ................ 702/63 |
| 5,914,605 A | 6/1999 | Bertness ..................... 324/430 |
| 5,929,609 A | 7/1999 | Joy et al. ....................... 322/25 |
| 5,939,855 A | 8/1999 | Proctor et al. ............... 320/104 |
| 5,939,861 A | 8/1999 | Joko et al. |
| 5,945,829 A | 8/1999 | Bertness ..................... 324/430 |
| 5,969,625 A | 10/1999 | Russo ......................... 340/636 |
| 6,002,238 A | 12/1999 | Champlin ................... 320/134 |
| 6,008,652 A | 12/1999 | Theofanopoulos et al. . 324/434 |
| 6,009,369 A | 12/1999 | Boisvert et al. ............... 701/99 |
| 6,031,354 A | 2/2000 | Wiley et al. ................ 320/116 |
| 6,031,368 A * | 2/2000 | Klippel et al. .............. 324/133 |
| 6,037,751 A | 3/2000 | Klang ........................ 320/160 |
| 6,037,777 A | 3/2000 | Champlin ................... 324/430 |
| 6,051,976 A | 4/2000 | Bertness ..................... 324/426 |
| 6,072,299 A | 6/2000 | Kurie et al. ................. 320/112 |
| 6,072,300 A | 6/2000 | Tsuji ........................... 320/116 |
| 6,081,098 A | 6/2000 | Bertness et al. ............. 320/134 |
| 6,081,109 A * | 6/2000 | Seymour et al. ............ 324/127 |
| 6,091,245 A | 7/2000 | Bertness ..................... 324/426 |
| 6,094,033 A | 7/2000 | Ding et al. .................. 320/132 |
| 6,104,167 A | 8/2000 | Bertness et al. ............. 320/132 |
| 6,114,834 A | 9/2000 | Parise ......................... 320/109 |
| 6,137,269 A | 10/2000 | Champlin ................... 320/150 |
| 6,140,797 A * | 10/2000 | Dunn .......................... 320/105 |
| 6,150,793 A | 11/2000 | Lesesky et al. ............. 320/104 |
| 6,161,640 A | 12/2000 | Yamaguchi ................. 180/65.8 |
| 6,163,156 A | 12/2000 | Bertness ..................... 324/426 |
| 6,172,483 B1 | 1/2001 | Champlin ................... 320/134 |
| 6,172,505 B1 | 1/2001 | Bertness ..................... 324/430 |
| 6,181,545 B1 | 1/2001 | Amatucci et al. ........... 361/502 |
| 6,222,369 B1 | 4/2001 | Champlin ................... 324/430 |
| 6,225,808 B1 | 5/2001 | Varghese et al. ............ 324/426 |
| 6,249,124 B1 | 6/2001 | Bertness ..................... 324/426 |
| 6,250,973 B1 | 6/2001 | Lowery et al. .............. 439/763 |
| 6,254,438 B1 | 7/2001 | Gaunt ......................... 439/755 |
| 6,259,170 B1 * | 7/2001 | Limoge et al. ............. 307/10.8 |
| 6,259,254 B1 | 7/2001 | Klang ......................... 324/427 |
| 6,262,563 B1 | 7/2001 | Champlin ................... 320/134 |
| 6,294,896 B1 | 9/2001 | Champlin ................... 320/134 |
| 6,294,897 B1 | 9/2001 | Champlin ................... 320/153 |
| 6,304,087 B1 | 10/2001 | Bertness ..................... 324/426 |
| 6,310,481 B2 | 10/2001 | Bertness ..................... 324/430 |
| 6,313,607 B1 | 11/2001 | Champlin ................... 320/132 |
| 6,313,608 B1 | 11/2001 | Varghese et al. ............ 320/132 |
| 6,316,914 B1 | 11/2001 | Bertness ..................... 320/134 |
| 6,323,650 B1 | 11/2001 | Bertness et al. ............. 324/426 |
| 6,329,793 B1 | 12/2001 | Bertness et al. ............. 320/132 |
| 6,331,762 B1 | 12/2001 | Bertness ..................... 320/134 |
| 6,332,113 B1 | 12/2001 | Bertness ....................... 702/63 |
| 6,346,795 B2 | 2/2002 | Haraguchi et al. .......... 320/136 |
| 6,347,958 B1 * | 2/2002 | Tsai ........................... 439/488 |

FOREIGN PATENT DOCUMENTS

| | | |
|---|---|---|
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

"#12: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–4$^{th}$–Order Elliptic Notch Filter", 12/94, RRD–B30M115, Dec. 1994.

"Electrochemical Impedance Spectroscopy in Battey Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al. *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

\* cited by examiner

BATTERY CLAMP WITH INTEGRATED CURRENT SENSOR

BACKGROUND OF THE INVENTION

The present invention generally relates to testing and charging of storage batteries. More specifically, the present invention relates to a battery clamp with an integrated current sensor.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batters consist of a plurality of individual storage cells electrically connected in series. Typically, each cell has a voltage potential of about 2.1 volts. By connecting the cells in series, the voltage of the individual cells are added in a cumulative manner. For example, in a typical automotive storage battery, six storage cells are used to provide a total voltage when the battery is fully charged up to 12.6 volts.

Several techniques have been used to test the condition of storage batteries. These techniques include a voltage test to determine if the battery voltage is below a certain threshold, and a load test that involves discharging a battery using a known load. A more recent technique involves measuring the conductance of the storage batteries. Several current measurements may have to be performed to accurately test the condition of storage batteries. First, a current measurement may be required in addition to measuring a voltage across the battery. Further, when multiple batteries are electrically coupled together in a cumulative manner and one battery needs to be tested, then currents passing through different conductors coupling other batteries to the battery under test may need to be measured in order to obtain accurate test results. A separate current sensor can be used to measure these different currents. However, employing a separate current sensor for a battery test circuit makes the equipment more complex for a user to operate in the harsh and often constrained environment associated with automotive battery testing.

SUMMARY OF THE INVENTION

In accordance with one aspect of the present invention, an apparatus configured to couple to a battery contact is provided. The apparatus includes an electrical connector for connection to a battery contact and a current sensor coupled to the electrical connector, the current sensor is used for measuring current through an electrical conductor.

In accordance with another aspect of the present invention, a battery testing system employing an electrical connector with a coupled current sensor is provided.

BRIEF DESCRIPTION OF THE DRAWINGS

FIG. 2 is a simplified block diagram of a combined clamp and current sensor of the present invention.

FIG. 3 shows a combined clamp and current sensor that provides a Kelvin connection to a battery in accordance with an embodiment of the present invention.

FIGS. 4-1 and 4-2 show simplified block diagrams of combined clamp and current sensors in accordance with embodiments of the present invention.

FIGS. 5-1 to 5-4 show perspective views of combined clamp and current sensors in accordance with other embodiments of the present invention.

FIGS. 6-1 to 6-3 show different embodiments of current sensors employed in the present invention.

FIG. 6-4 shows a combined clamp and current sensor including a Hall-effect sensor and a core in accordance with an embodiment of the present invention.

FIG. 7-1 is a simplified block diagram of a battery testing system incorporating a combined battery clamp and current sensor in accordance with the present invention.

FIG. 7-2 is a simplified block diagram of the embodiment of the present invention described in FIG. 7-1 used for measuring current flowing through batteries in battery bank.

DETAILED DESCRIPTION OF THE ILLUSTRATIVE EMBODIMENTS

Figure 1:
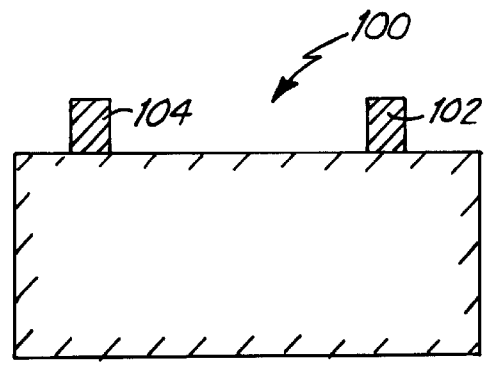
FIGS. 1-1 to 1-3 illustrate cross-sections of prior art battery contacts that the combined clamp and current sensor of the present invention is capable of grasping.
Figures 1, 2:
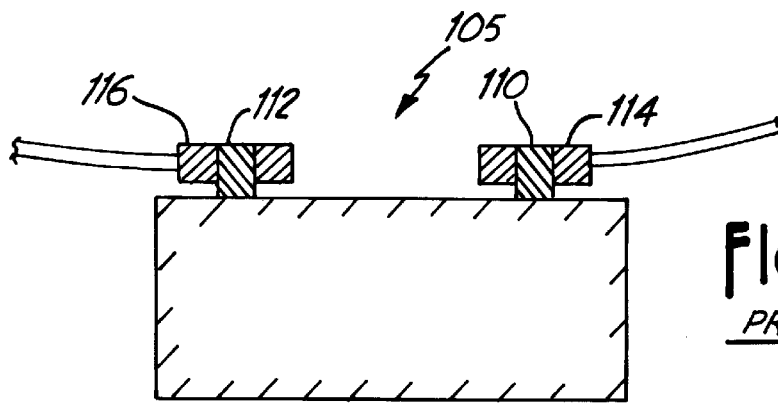
Figures 1, 2, 3:
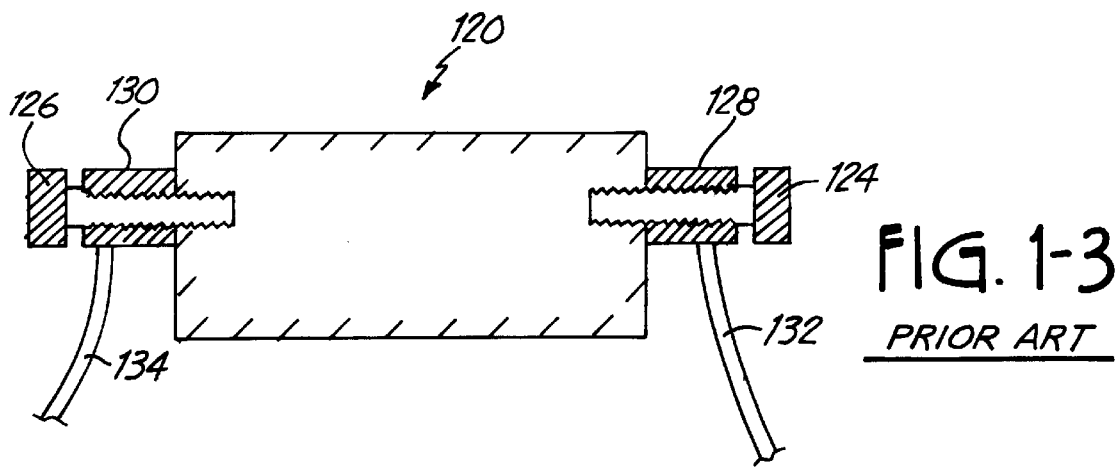
Figure 2:
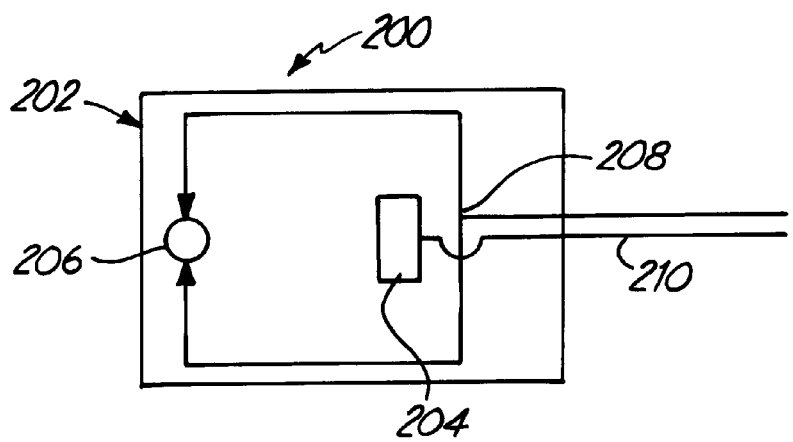
Figure 3:
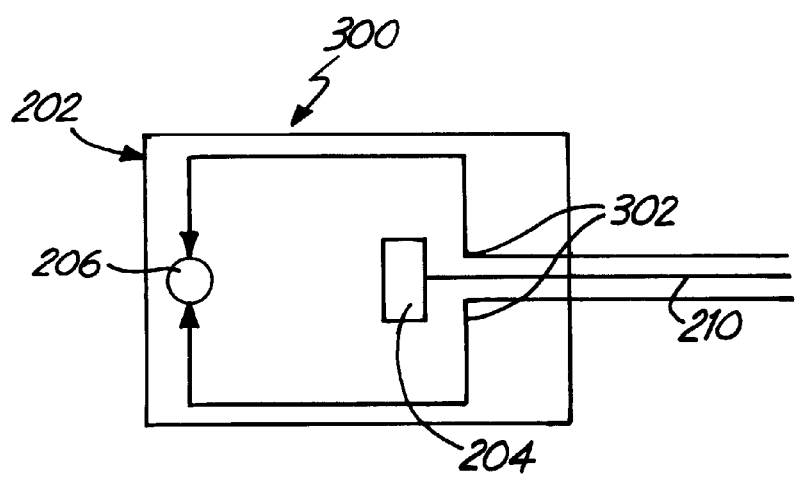

In the discussion below, the term "battery contact" is used to define a portion of the battery onto which the combined clamp and current sensor of the present invention can be applied. Prior art FIGS. 1-1 to 1-3 illustrate examples of different battery contacts that the combined clamp and current sensor of the present invention is capable of grasping. In FIG. 1-1, battery contact refers to either terminal 102 or terminal 104 of battery 100. FIG. 1-2 shows battery 105 connected with clamps that connect to an external circuit (not shown). Here the term battery contact refers to a battery terminal with an attached clamp. Thus, either terminal 110 with attached clamp 114 or terminal 112 with attached clamp 116 qualifies as a battery contact to which the combined clamp and current sensor of the present invention can be applied. Similarly, FIG. 1-3 shows battery 120 with clamps that grip bolts (terminals) connected to sides of battery 120 and connect to an external circuit (not shown). Here either bolt 124 with attached clamp 128 or bolt 126 with attached clamp 130 qualifies as a battery contact. The term battery contact is not restricted in application to the illustrative examples of FIGS. 1-1 to 1-3.

FIG. 2 shows a combined clamp and current sensor 200 in accordance with an embodiment of the present invention. Combined clamp and current sensor 200 is designed to permit application to a battery contact or disconnection thereto when desired. Combined clamp and current sensor 200 includes an electrical connector, shown generally by block 202, that grips on to battery contact 206 preferably with a large force in order to withstand high current when, for example, an automobile starts. Various types of electrical connectors, some of which are described further below, can be used for grasping battery contact 206. Also included is current sensor 204 which is integrated with electrical connector 202. Current sensor 204 can be used to simultaneously measure battery current during battery testing or charging when electrical connector 202 is coupled to battery contact 206. Further, current sensor 204 can be used for other current measurements, such as for determining current through individual batteries of a battery bank. Examples of current sensors include Hall-effect current sensors, magnetometer current sensors, magneto-optic current sensors and current shunt sensors. Connection to external electrical circuits from electrical connector 202 is provided by single-ended electrical connection 208 which is embedded within electrical connector 202. Current sensor 204 is connected to external circuitry via connection 210. Thus, a single combined clamp and current sensor 200 can be applied to a battery contact to connect charge/test equipment and simultaneously measure battery current during the charging/testing process and also for various other current measurements.

FIG. 3 shows combined clamp and current sensor 300 which is similar to combined clamp and current sensor 200. The same reference numerals have been used to represent the same or similar elements. A Kelvin electrical connection 302 is provided in combined clamp and current sensor 300 instead of the single-ended electrical connection 208 of combined clamp and current sensor 200 with all other elements being substantially similar. Kelvin connection 302, described in detail further below, is used for advanced battery testing techniques and includes two electrical connections or probes for each battery contact.

Figures 1, 4:
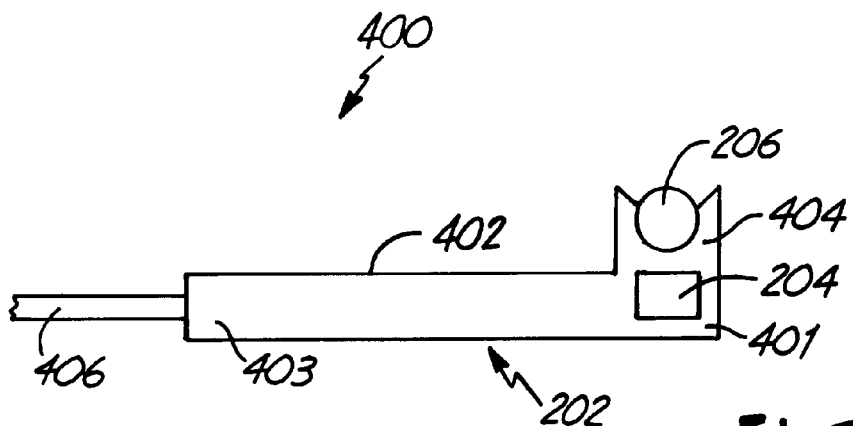
Figures 2, 4:
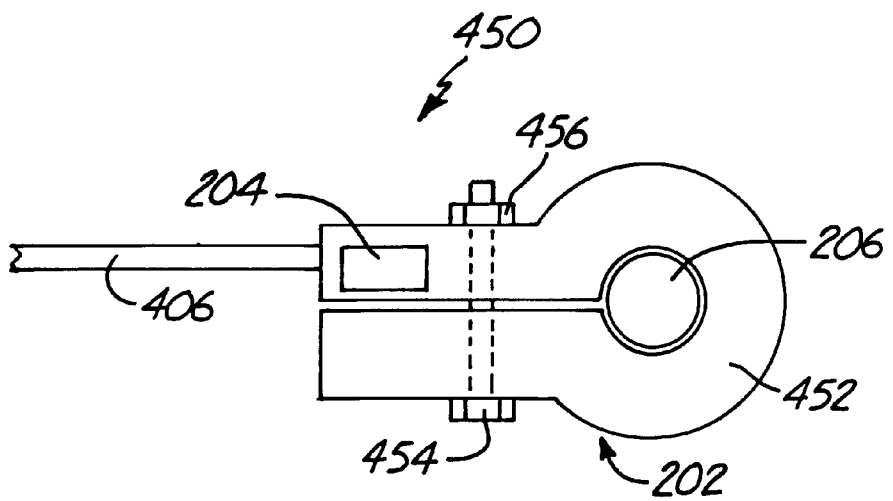

FIG. 4-1 is a simplified block diagram illustrating combined clamp and current sensor 400 in accordance with another embodiment of the present invention. Combined clamp and current sensor 400 includes electrical connector 202, sensor 204 and electrical connection 406. Electrical connector 202 includes an arm 402 and grasping member 404. Grasping member 404 is connected to front end 401 of arm 402 and grips on to battery contact 206. Sensor 204 is also connected to front end 401 of arm 402. Electrical connection 406 shown at rear end 403 of arm 402 runs within arm 402 and connects grasping member 404 and sensor 204 to external circuitry. FIG. 4-2 illustrates a block diagram of a combined clamp and current sensor 450 similar to device 400 (of FIG. 4-1) in accordance with another embodiment of the present invention. Combined clamp and current sensor 450 includes electrical connector 202 that has a grasping mechanism 452 that is held around battery contact 206 by bolt 454 and nut 456 (bolt-on clamp). Grasping member 452 may also be flexible clip-on clamp that does not require a bolt and nut to be held in place. Device 450 includes sensor 204 connected to grasping mechanism 452. Electrical connection 406 connects device 450 to external circuitry.

Figures 1, 5:
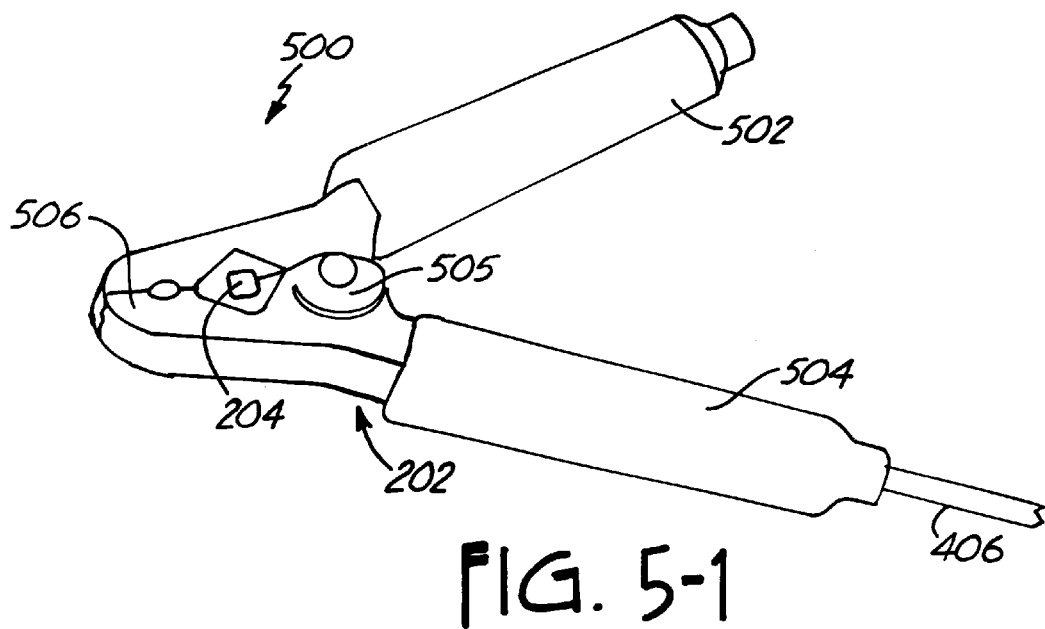
Figures 2, 5:
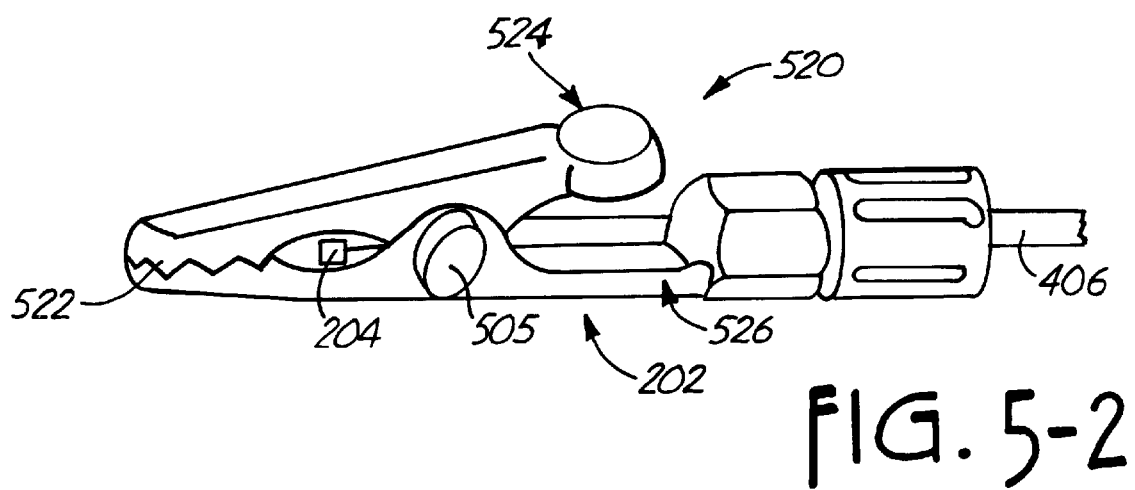
Figures 3, 5:
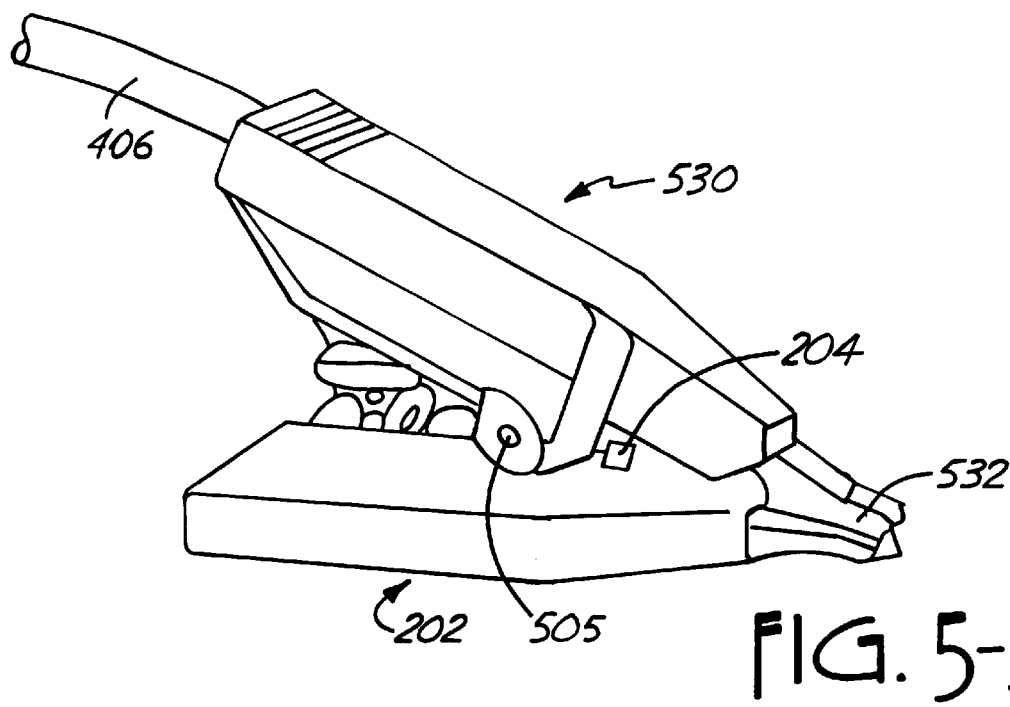
Figures 4, 5:
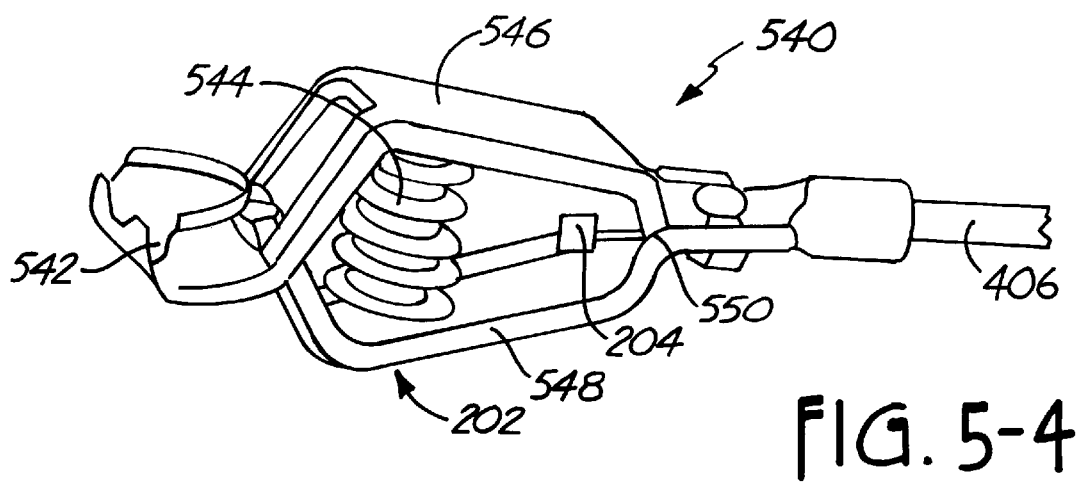

FIGS. 5-1 to 5-4 illustrate perspective views of combined clamp and current sensors which include clip-type electrical connectors for grasping battery contacts.

FIG. 5-1 shows a perspective view of a combined clamp and current sensor 500 in accordance with another embodiment of the present invention. Device 500 includes an electrical connector 202 which is a Plier-Type clip having arms 502 and 504 connected together by pivot 505 and a gripping portion 506 that can be opened or closed with the help of arms 502 and 504. Sensor 505 is shown connected to the Plier-Type clip at pivot 505 but may be connected to different portions of the Plier-Type clip. Electrical connection 406 connects the Plier-Type clip and the sensor to external circuitry. In FIG. 5-2, combined clamp and current sensor 520 includes an electrical connector 202 which is an Alligator or Crocodile clip having meshing jaws 522, used for making temporary electrical connections. Sensor 204 is show connected to the Alligator clip at pivot 505. Meshing jaws 522 are opened by applying force on upper portion 524 in a direction towards lower portion 526. Electrical connection 406 couples the alligator clip to external electrical circuits. FIG. 5-3 shows a combined clamp and current sensor 530 with electrical connector 202 being a Kelvin clip used for 4-wire resistance measurements. Jaws 532 are electrically isolated when the clip is open and shorted when the clip is closed. Sensor 204 is connected near pivot 505 and electrical connection 406 couples the Kelvin clip to external circuitry. In FIG. 5-4, combined clamp and current sensor 540 includes a electrical connector 202 which is a Pee-Wee clip, used for making temporary electrical connections. Typically, Pee-Wee clips are made of copper. Grasping mechanism 542 is opened/closed by the compression/expansion of spring 544 accomplished by moving upper portion 546 and lower portion 548 towards or away from each other. Sensor 204 is coupled to the Pee-Wee clip at rear junction 550 of upper portion 546 and lower portion 548. Electrical connection 406 couples the Pee-Wee clip to external circuitry.

The different clamps (electrical connectors) employed in the embodiments of the combined clamp and current sensors described above are only illustrative in nature and those skilled in the art will appreciate that the present invention may be practiced with any clamp (electrical connector) capable of electrically coupling to a battery contact. Also, the current sensor may be positioned anywhere on the electrical connector. Illustrative examples of current sensors are included below.

Figures 1, 6:
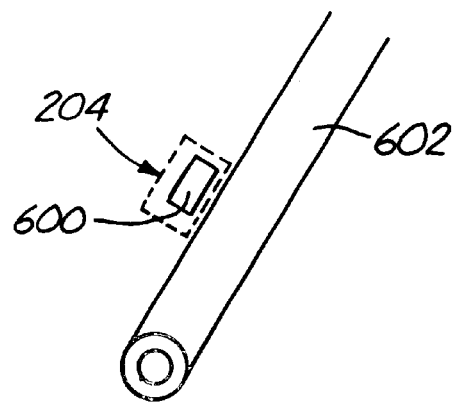
Figures 2, 6:
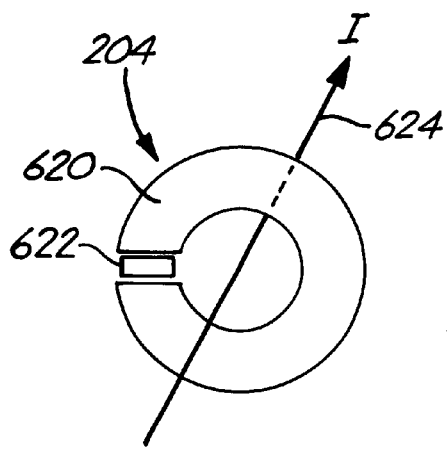
Figures 3, 6:
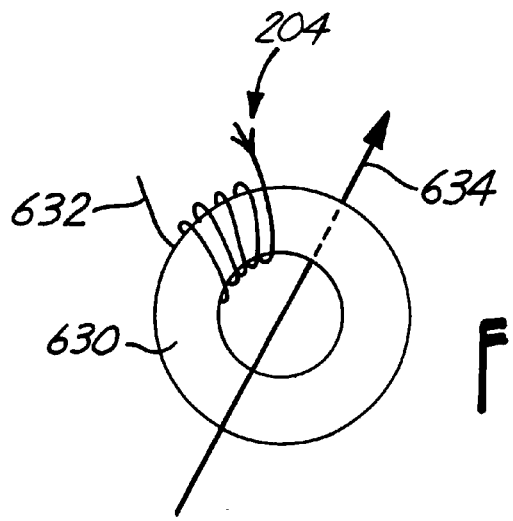
Figures 4, 6:
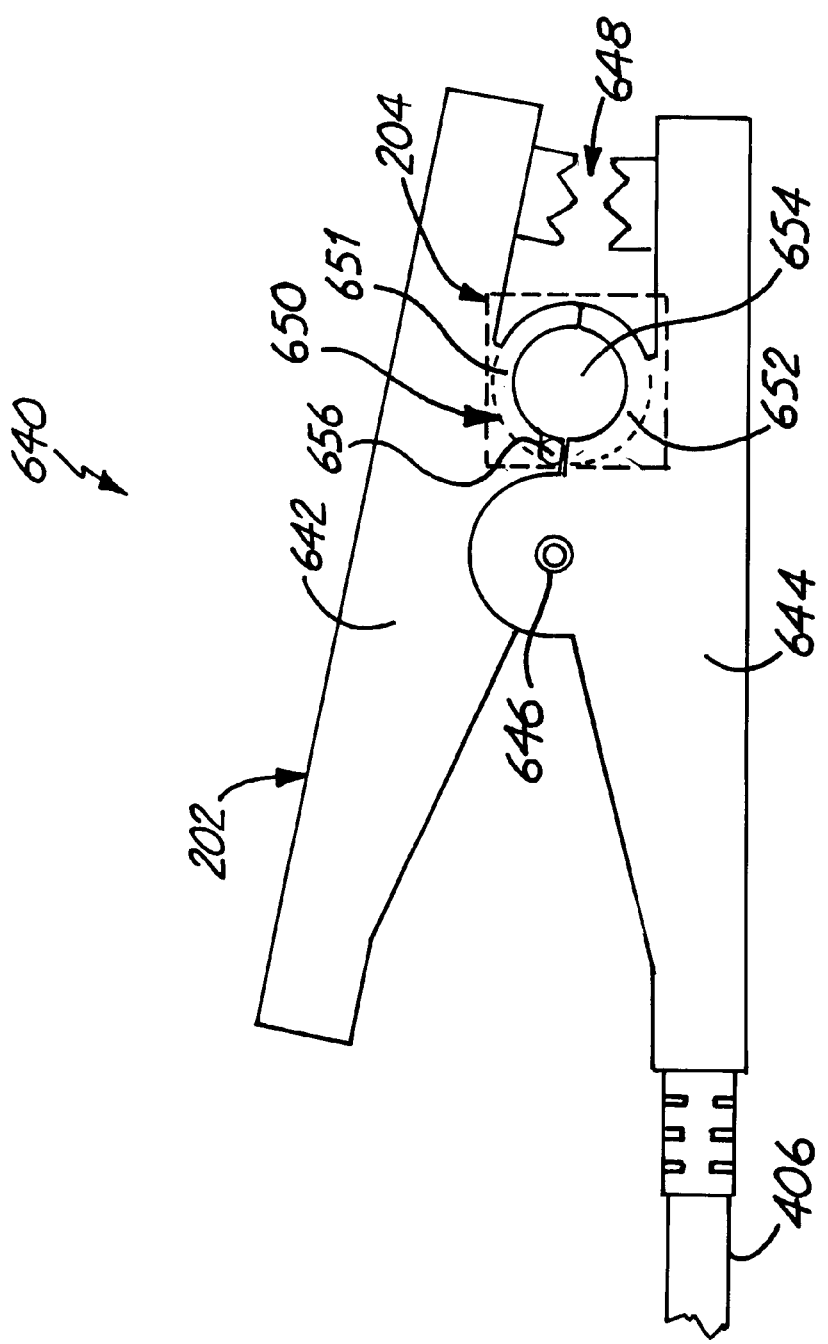

One example of a current sensor that may be employed is in the present invention is shown in FIG. 6-1. Here current sensor 204 is a Hall-effect current sensor 600 that senses current when positioned within a magnetic field produced by an electrical conductor 602. FIG. 6-2 shows a Hall-effect current sensor 622 positioned in a gap of a circular core 620 of soft magnetic material surrounding conductor 624 to concentrate the magnetic field. More accurate current measurements are obtained by using a core to concentrate the magnetic field. A Hall-effect sensor with a circular core coupled to a clip-type electrical sensor is described further below.

Another type of current sensor that may be employed in the present invention is shown in FIG. 6-3. Here current sensor 204 is a magnetometer current sensor which includes a circular core 630 and coil 632. When current is passed through coil 632, core 630 is magnetized. When core 630, magnetized by coil 632, is placed around current carrying conductor 634, the magnetization changes. This change in magnetization which is proportional to the current flowing through conductor 634 is used to determine current I. The magnetometer current sensor is capable of measuring alternating current and step changes in direct current. The Hall-effect current sensor is capable of measuring both alternating and direct current.

In addition to the current sensors described above, any type of current sensor including magntoresistive current sensors, magneto-optic current sensors, current shunt sensors, etc., may also be employed in the present invention.

FIG. 6-4 shows a combined clamp and current sensor 640 including a Hall-effect sensor and a core in accordance with an embodiment of the present invention. Device 640 includes electrical connector 202 which is a clip having upper arm 642 and lower arm 644 connected together by pivot 646, and a grasping portion 648 that can be opened and closed with the help of arms 642 and 644. Current sensor 204 is connected to clip (electrical connector 202) at pivot 646. Current sensor 204 includes laminated core 650 and Hall-effect sensor 656. Laminated core 650 includes upper portion 651 attached to upper arm 642 and lower portion 652 coupled to lower arm 644. Core 650 encloses a current sensing area 654 when clip 202 is in a substantially closed position. Hall-effect sensor 656 senses current flowing through an electrical conductor positioned within current sensing area 654. Electrical connection 406 connects the clip-type electrical connector and the current sensor to external circuitry.

When a magnetometer current sensor (shown in FIG. 6-3) is combined with a clip-type electrical connector, core 630 of the magnetometer sensor will be divided into an upper and lower portion in a manner substantially similar to core 650 (of FIG. 6-4).

Figures 1, 7:
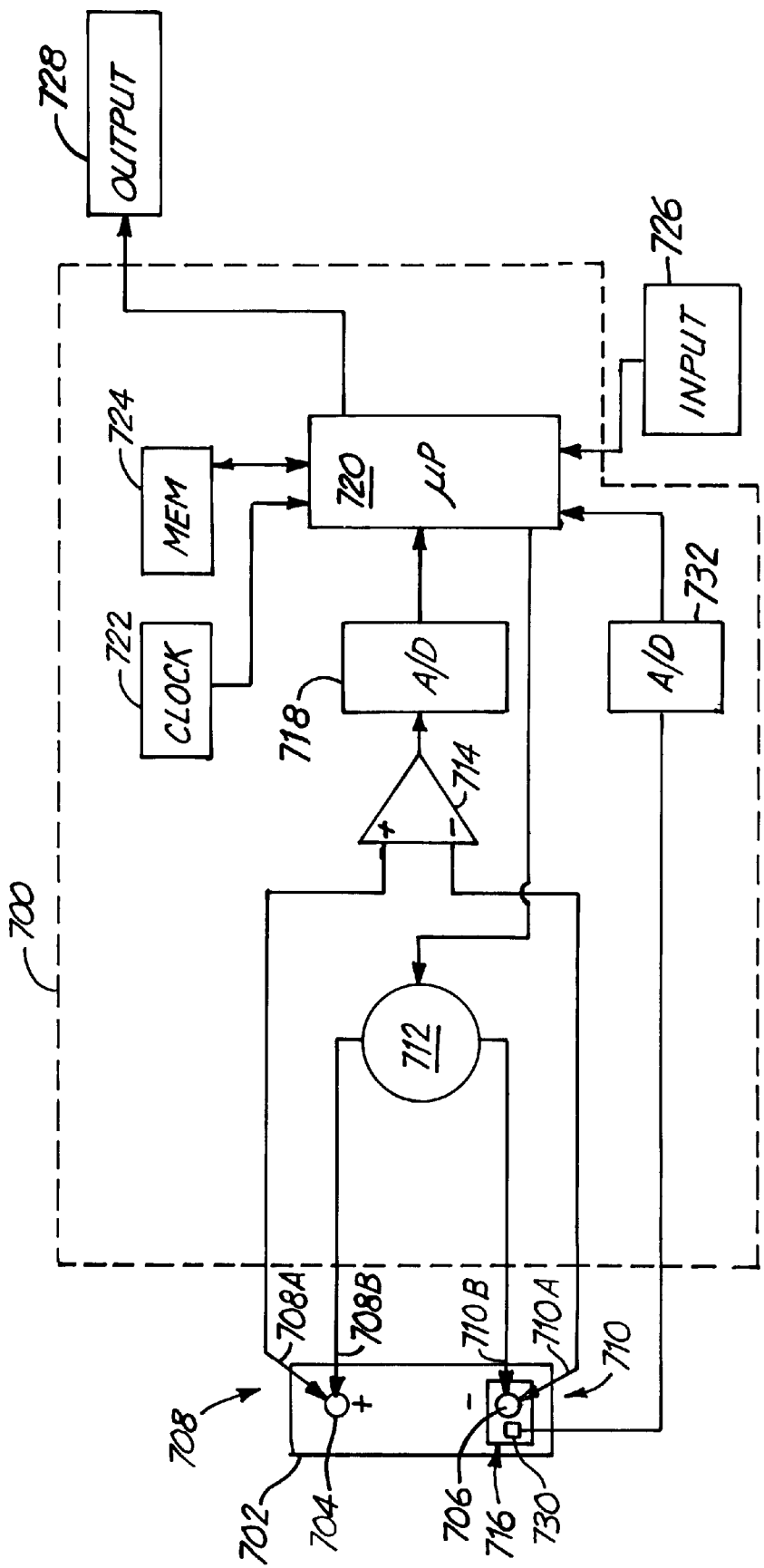
Figures 2, 7:
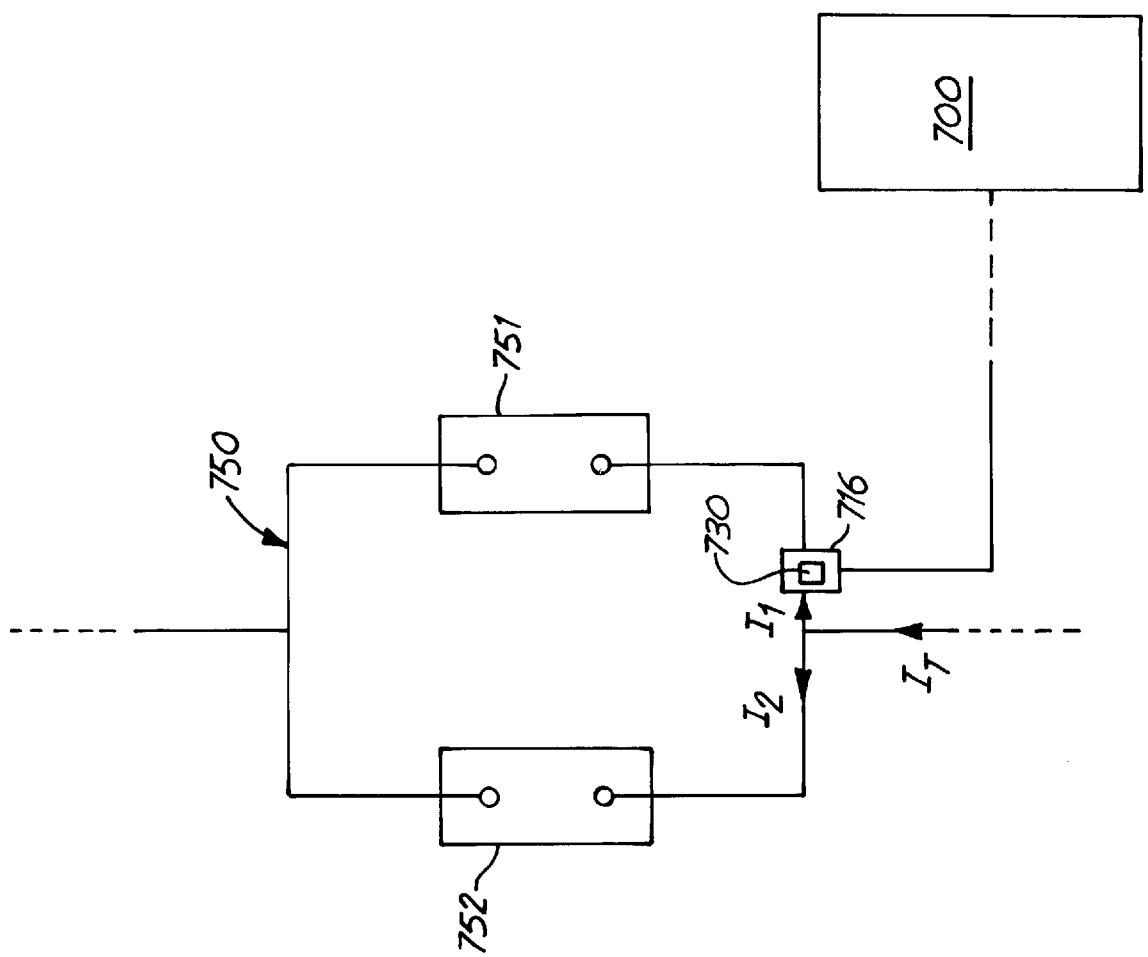

FIG. 7-1 is a simplified block diagram of electronic battery tester circuitry 700 with which the present invention is useful. A four point (or Kelvin connection technique is used to couple system 700 to battery 702. Kelvin connections 708 and 710 are used to couple to battery contacts 704 and 706, respectively, of battery 702. Kelvin connection 708 includes two individual connections 708A and 708B. Similarly, Kelvin connection 710 includes two individual connections, 710A and 710B. Electrical connectors (clamps) grasp battery contacts 704 and 706 and couple them to electrical connections 708 and 710. At least one electrical connector is a combined battery clamp and current sensor 716 of the present invention, (shown coupled to battery contact 706). For simplification, only one clamp is shown.

Circuitry 700 includes a current source 712 and a differential amplifier 714. Current source 712 is connected to connections 708B and 710B of Kelvin connections 708 and 710, respectively. Differential amplifier 714 is connected to connection 708A and connection 710A of Kelvin connections 708 and 710, respectively. An output from differential amplifier 714 is provided to analog to digital converter 718 which itself provides a digitized output to microprocessor 720. Microprocessor 720 is connected to a system clock 722, a memory 724, and analog to digital converter 718. Microprocessor 720 is also capable of receiving an input from an input device 726 and providing an output on output device 728. The input can be, for example, a rating for the battery 702. Input device 726 can comprise any or multiple types of input devices. The result of a battery test, either qualitative or quantitative, can be an output device 728. Device 728 can be a display or other output. Current sensor 730 of device 716 connects to microprocessor 720 through analog to digital converter 732. Current sensor 730 senses a current I flowing through battery 702. Sensor 730 can be any type of current sensor and functions as described above. The invention can operate with any technique for determining a voltage across battery 702 and a current through battery 702 and is not limited to the specific techniques set forth herein. The current source 712 can be any signal having a time varying component, including a stepped pulse or a periodic signal, having any shape, applied to battery 702. The current source can be an active source in which the current source signal is injected into battery 702, or can be a passive source, such as a load, which is switched on under the control of microprocessor 720.

In operation, microprocessor 720 can receive an input through input 720, such as a rating for battery 702. Microprocessor 720 determines a dynamic parameter, such as dynamic conductance, of battery 702 as a function of the sensed voltage V as measured by differential amplifier 714 and the sensed current I as measured by current sensor 730. The change in these measured values is used to determine the dynamic parameter. For example, the dynamic conductance (ΔG) is determined as:

$$\Delta G = \Delta I / \Delta V \qquad \text{EQ. 1}$$

The dynamic parameter can be correlated to a condition of the battery which can be used as a basis for comparison of the battery against a battery rating.

FIG. 7-2 is a simplified block diagram the embodiment of the present invention described in FIG. 7-1 used for measuring current flowing through batteries in battery bank 750. Bank 750 is illustrated as two batteries, storage battery 751 and storage battery 752, connected in parallel. Here, combined battery clamp and current sensor 716 of battery tester 700 (of FIG. 7-1) is positioned to measure a current $I_1$ flowing through battery 751 when battery 751 is not simultaneously being tested. Device 716 can also be used in a similar manner to measure total current, $I_T$ flowing through battery bank 750 or $I_2$, the current through battery 752 by placing it an appropriate position. Thus, device 716 can be used for simultaneous current measurement when clamped to a battery contact during battery testing as described in FIG. 7-1 or only for current measurement as shown in FIG. 7-2.

Figure 8:
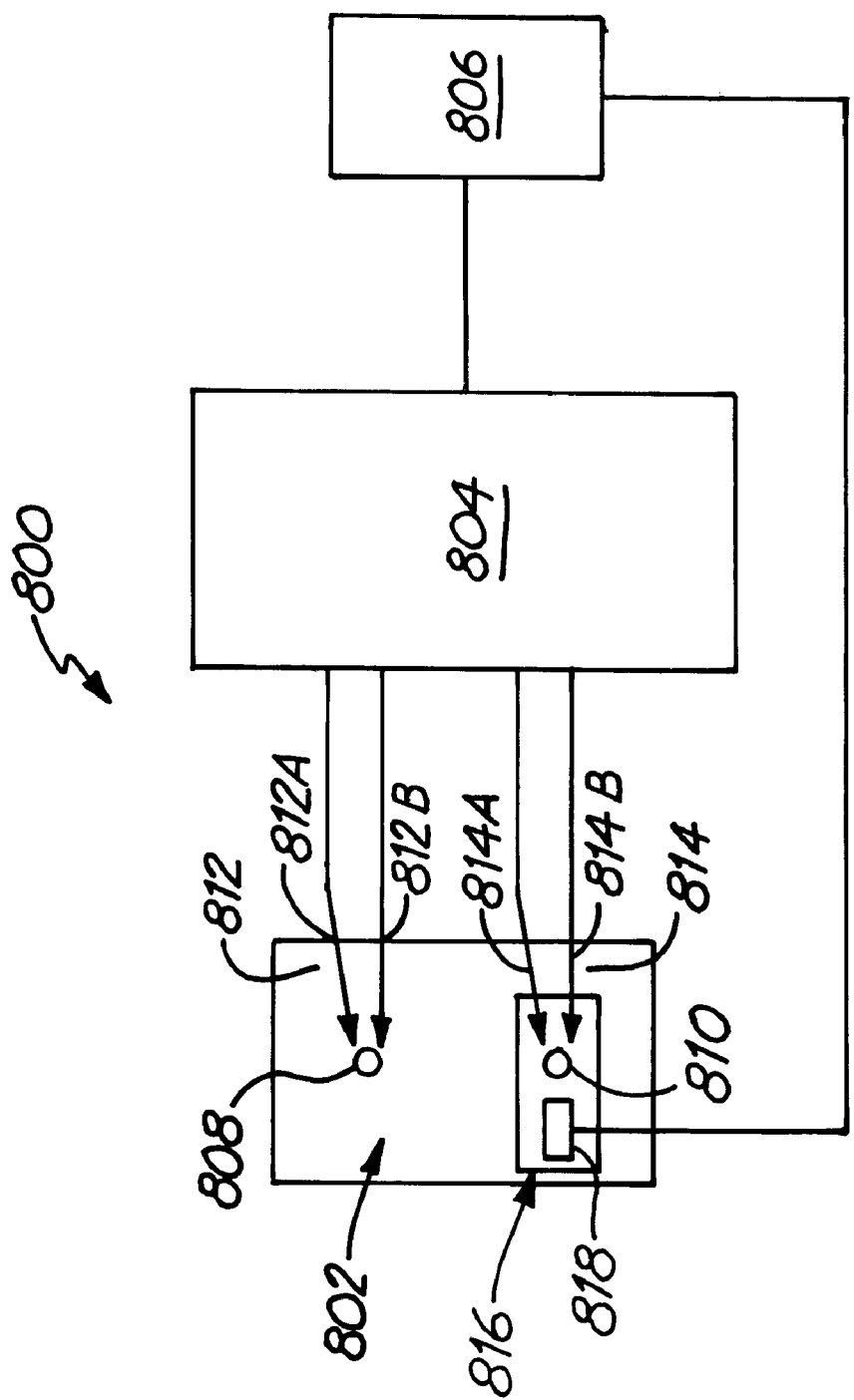
FIG. 8 is a simplified block diagram of a battery charging system using the present invention.

FIG. 8 is a simplified block diagram of a battery charging system 800 using the present invention. System 800 is shown coupled to battery 802. System 800 includes battery charging circuitry 804 and microprocessor 806. System 800 couples to battery contacts 808 and 810 through electrical connections 812 and 814 respectively. In one preferred embodiment, a four point (or Kelvin) connection technique is used. Here, electrical connection 812 includes a first connection 812A and second connection 812B and connection 814 includes a first connection 814A and a second connection 814B. Coupling between battery contacts 808 and 810 and electrical connections 812 and 814 is provided by combined battery clamp and current sensor of the present invention that grasps on to each battery contact. For simplification, only one combined battery clamp and current sensor 816 is shown grasping battery contact 810. Current sensor 818 of combined battery clamp and current sensor 816 is coupled to microprocessor 806. Current sensor 818 senses current through battery 802 in a manner substantially similar to that described in the explanation for battery testing system 700 above.

Although the present invention has been described with reference to preferred embodiments, workers skilled in the art will recognize that changes may be made in form and detail without departing from the spirit and scope of the invention. In general, the invention is directed to a combined battery clamp and current sensor and is not restricted to the types of clamp and current sensor combinations described in the illustrative embodiments. Also, the combined battery clamp and current sensor can be used to measure current through electrical conductors of different electrical circuits other than those described above. The invention can be employed in battery charging, testing and other similar systems.

What is claimed is:

1. An apparatus configured to couple to a battery comprising:
   an electrical connector configured to electrically connect to a battery contact; and
   a current sensor coupled to the electrical connector, the current sensor configured to measure current flowing through an electrical conductor, connected to the battery contact, when the electrical connector of the apparatus is not connected to the battery contact.

2. The apparatus of claim 1, wherein the electrical system is an automobile electrical system.

3. The apparatus of claim 1, wherein the current sensor is further adapted to measure battery current.

4. The apparatus of claim 1, wherein the electrical connector is adapted to electrically couple a single ended electrical connection to the battery contact.

5. The apparatus of claim 1, wherein the electrical connector is adapted to electrically couple a Kelvin connection to the battery contact.

6. The apparatus of claim 1, wherein the electrical connector comprises:

an arm; and a grasping member positioned at a front end of the arm and adapted to grip the battery contact.

7. The apparatus of claim 1, wherein the electrical connector includes a bolt-on clamp.

8. The apparatus of claim 1, wherein the electrical connector includes a clip-on clamp.

9. The apparatus of claim 1, wherein the electrical connector comprises a Plier-Type clip.

10. The apparatus of claim 1, wherein the electrical connector comprises an Alligator clip.

11. The apparatus of claim 1, wherein the electrical connector comprises a Kelvin clip.

12. The apparatus of claim 1, wherein the electrical connector comprises a Pee-Wee clip.

13. The apparatus of claim 1, wherein the current sensor comprises a Hall-effect sensor.

14. The apparatus of claim 13, wherein the Hall-effect sensor is positioned between an air gap of a soft iron core.

15. The apparatus of claim 14, wherein the soft iron core is divided into an upper portion and a lower portion to operably couple to a clip-type electrical connector.

16. The apparatus of claim 1, wherein the current sensor comprises a magnetometer current sensor.

17. The apparatus of claim 1, wherein the current sensor comprises a magnetoresistive current sensor.

18. The apparatus of claim 1, wherein the current sensor comprises a magneto-optic current sensor.

19. The apparatus of claim 1, wherein the current sensor comprises a current shunt sensor.

20. A battery tester employing the electrical connector with coupled current sensor of claim 1.

21. The apparatus of claim 20, wherein the current sensor is adapted to measure current simultaneously during battery testing.

22. The apparatus of claim 20, wherein the current sensor is adapted to measure total current flowing through a battery bank.

23. The apparatus of claim 20, wherein the current sensor is coupled to a microprocessor included in the battery tester, such that feedback from the current sensor is used to compute battery test results.

24. A battery charger employing the electrical connector with coupled current sensor of claim 1.

25. A method of forming a device that couples an electrical circuit to a battery contact, the method comprising:

(a) providing an electrical connector configured to electrically connect the electrical circuit to the battery contact; and (b) coupling a current sensor to the electrical connector, the current sensor configured to measure current flowing through an electrical conductor, connected to the battery contact, when the electrical connector of the apparatus is not connected to the battery contact.

26. The method of claim 25, wherein the electrical system is an automobile electrical system.

27. The method of claim 25, wherein the current sensor is further adapted to measure battery current.

28. The method of claim 25, wherein the electrical connector is capable of electrically coupling a single ended electrical connection to the battery contact.

29. The method of claim 25, wherein the electrical connector is capable of electrically coupling a Kelvin connection to the battery contact.

30. The method of claim 25, wherein the providing an electrical connector step (a) includes providing a bolt-on clamp.

31. The method of claim 25, wherein the providing an electrical connector step (a) includes providing a clip-on clamp.

32. The method of claim 25, wherein the providing an electrical connector step (a) includes providing a Plier-Type clip.

33. The method of claim 25, wherein the providing an electrical connector step (a) includes providing an Alligator clip.

34. The method of claim 25, wherein the providing an electrical connector step (a) includes providing a Kelvin clip.

35. The method of claim 25, wherein the providing an electrical connector step (a) includes providing a Pee-Wee clip.

36. The method of claim 25, wherein the coupling a current sensor step (b) includes coupling a Hall-effect sensor.

* * * * *

UNITED STATES PATENT AND TRADEMARK OFFICE
CERTIFICATE OF CORRECTION

PATENT NO. : 6,544,078 B2
DATED : April 8, 2003
INVENTOR(S) : Palmisano et al.

It is certified that error appears in the above-identified patent and that said Letters Patent is hereby corrected as shown below:

<u>Title page,</u>
Item [56], References Cited, U.S. PATENT DOCUMENTS, please add:

| | | | |
|---|---|---|---|
| -- 5,037,778 | 8/1991 | Stark et al. | 437/216 |
| 5,711,648 | 1/1998 | Hammerslag | 414/786 |
| 5,927,938 | 7/1999 | Hammerslag | 414/809 |
| 5,951,229 | 9/1999 | Hammerslag | 414/398 |
| 5,961,561 | 10/1999 | Walefield, II. | 701/29 |
| 5,961,604 | 10/1999 | Anderson et al. | 709/229 |
| 6,236,332 | 5/2001 | Conkright et al. | 340/825.06 |
| 6,351,102 | 2/2002 | Troy | 320/139 |
| 6,359,441 | 3/2002 | Bertness | 324/426 |
| 6,363,303 | 3/2002 | Bertness | 701/29 |
| 6,144,185 | 11/2000 | Dougherty et al. | 320/132 --. |

Signed and Sealed this

Nineteenth Day of August, 2003

JAMES E. ROGAN
*Director of the United States Patent and Trademark Office*